United States Patent
O'Donnell et al.

(10) Patent No.: US 7,605,086 B2
(45) Date of Patent: Oct. 20, 2009

(54) CORROSION RESISTANT COMPONENT OF SEMICONDUCTOR PROCESSING EQUIPMENT AND METHOD OF MANUFACTURE THEREOF

(75) Inventors: Robert J. O'Donnell, Alameda, CA (US); Christopher C. Chang, Sunnyvale, CA (US); John E. Daugherty, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/525,102

(22) Filed: Sep. 22, 2006

(65) Prior Publication Data
US 2007/0012657 A1   Jan. 18, 2007

Related U.S. Application Data

(62) Division of application No. 09/749,921, filed on Dec. 29, 2000, now Pat. No. 7,128,804.

(51) Int. Cl.
*H01L 21/302* (2006.01)
(52) U.S. Cl. .................. 438/702; 438/762; 438/780; 438/787; 427/447
(58) Field of Classification Search .......... 438/702, 438/762, 780, 787; 427/447
See application file for complete search history.

(56) References Cited

U.S. PATENT DOCUMENTS

| | | |
|---|---|---|
| 4,340,462 A | 7/1982 | Koch |
| 4,491,496 A | 1/1985 | Laporte et al. |
| 4,736,087 A | 4/1988 | Whitlock et al. |
| 4,948,458 A | 8/1990 | Ogle |
| 5,200,232 A | 4/1993 | Tappan et al. |
| 5,216,092 A | 6/1993 | Huspeni et al. |
| 5,248,530 A | 9/1993 | Jester et al. |

(Continued)

FOREIGN PATENT DOCUMENTS

EP     0443778 A1    8/1991

(Continued)

OTHER PUBLICATIONS

Nakwgawa, Shinichi (WO 99/63584), "Resin Molded Article for Chamber Liner", Dec. 9, 1999, World Intellectual Property Organization.*

(Continued)

*Primary Examiner*—Binh X Tran
(74) *Attorney, Agent, or Firm*—Buchanan Ingersoll & Rooney PC

(57) ABSTRACT

A corrosion resistant component of a plasma chamber includes a liquid crystalline polymer. In a preferred embodiment, the liquid crystalline polymer (LCP) is provided on an aluminum component having an anodized or non-anodized surface. The liquid crystalline polymer can also be provided on an alumina component. The liquid crystalline polymer can be deposited by a method such as plasma spraying. The liquid crystalline polymer may also be provided as a preformed sheet or other shape adapted to cover the exposed surfaces of the reaction chamber. Additionally, the reactor components may be made entirely from liquid crystalline polymer by machining the component from a solid block of liquid crystalline polymer or molding the component from the polymer. The liquid crystalline polymer may contain reinforcing fillers such as glass or mineral fillers.

13 Claims, 2 Drawing Sheets

U.S. PATENT DOCUMENTS

| | | | |
|---|---|---|---|
| 5,262,029 A | 11/1993 | Erskine et al. | |
| 5,296,542 A | 3/1994 | Layton et al. | |
| 5,366,585 A | 11/1994 | Robertson et al. | |
| 5,396,104 A | 3/1995 | Kimura | |
| 5,397,502 A | 3/1995 | Waggoner et al. | |
| 5,413,058 A | 5/1995 | Hirose et al. | |
| 5,434,210 A * | 7/1995 | Rangaswamy et al. | 524/406 |
| 5,474,649 A | 12/1995 | Kava et al. | |
| 5,522,932 A | 6/1996 | Wong et al. | |
| 5,606,485 A | 2/1997 | Shamouilian et al. | |
| 5,641,375 A | 6/1997 | Nitescu et al. | |
| 5,680,013 A | 10/1997 | Dornfest et al. | |
| 5,718,967 A | 2/1998 | Hu et al. | |
| 5,720,818 A | 2/1998 | Donde et al. | |
| 5,798,016 A | 8/1998 | Oehrlein et al. | |
| 5,820,723 A | 10/1998 | Benjamin et al. | |
| 5,824,605 A | 10/1998 | Chen et al. | |
| 5,838,529 A | 11/1998 | Shufflebotham et al. | |
| 5,863,376 A | 1/1999 | Wicker et al. | |
| 5,879,523 A | 3/1999 | Wang et al. | |
| 5,885,356 A | 3/1999 | Zhao et al. | |
| 5,895,586 A | 4/1999 | Kaji et al. | |
| 5,939,153 A | 8/1999 | Valyi | |
| 6,013,749 A | 1/2000 | Baba et al. | |
| 6,048,798 A | 4/2000 | Gadgil et al. | |
| 6,048,919 A | 4/2000 | McCullough | |
| 6,120,854 A | 9/2000 | Clarke et al. | |
| 6,250,251 B1 | 6/2001 | Akiyama et al. | |
| 6,251,216 B1 | 6/2001 | Okamura et al. | |
| 6,261,974 B1 * | 7/2001 | Kawahara et al. | 438/781 |
| 6,294,261 B1 | 9/2001 | Sangeeta et al. | |
| 6,319,325 B1 | 11/2001 | Hiratsuka et al. | |
| 6,326,597 B1 | 12/2001 | Lubomirsky et al. | |
| 6,372,299 B1 | 4/2002 | Thompson et al. | |
| 6,403,491 B1 * | 6/2002 | Liu et al. | 438/710 |
| 6,468,665 B1 | 10/2002 | Nagashima et al. | |
| 6,508,911 B1 | 1/2003 | Han et al. | |
| 6,703,092 B1 | 3/2004 | Nakagawa et al. | |
| 2001/0003271 A1 | 6/2001 | Otsuki | |
| 2002/0036881 A1 | 3/2002 | Shamouilian et al. | |

FOREIGN PATENT DOCUMENTS

| | | |
|---|---|---|
| EP | 0845545 A1 | 6/1998 |
| JP | 62-103379 | 5/1987 |
| JP | 03-269076 | 11/1991 |
| JP | 05-226796 | 9/1993 |
| JP | 09-298190 A | 11/1997 |
| JP | 10-229058 | 8/1998 |
| JP | 11-345780 | 12/1999 |
| JP | 2000-100781 A | 4/2000 |

OTHER PUBLICATIONS

Deronzier, J.C. et al., "Plate Heat Exchangers in Liquid-Crystal Polymers," Applied Thermal Engineering, vol. 17, Nos. 8-10, pp. 799-808, 1997.

Written Opinion dated Aug. 23, 2002 for PCT/US01/43152.

Notification of Transmittal of the International Search Report or the Declaration dated Aug. 21, 2006 for PCT/US01/43152.

* cited by examiner

CORROSION RESISTANT COMPONENT OF SEMICONDUCTOR PROCESSING EQUIPMENT AND METHOD OF MANUFACTURE THEREOF

CROSS-REFERENCE TO RELATED APPLICATIONS

This application is a divisional application of U.S. application Ser. No. 09/749,921 entitled CORROSION RESISTANT COMPONENT OF SEMICONDUCTOR PROCESSING EQUIPMENT AND METHOD OF MANUFACTURE THEREOF, filed on Dec. 29, 2000, now U.S. Pat. No. 7,128,804, the entire content of which is hereby incorporated by reference.

BACKGROUND OF THE INVENTION

1. Field of the Invention

The present invention relates generally to the fabrication of semiconductor wafers, and, more particularly, to high density plasma etching chambers having internal surfaces that reduce particle and metallic contamination during processing.

2. Description of the Related Art

In the field of semiconductor processing, vacuum processing chambers are generally used for etching and chemical vapor depositing (CVD) of materials on substrates by supplying an etching or deposition gas to the vacuum chamber and application of an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723. Because of the corrosive nature of the plasma environment in such reactors and the requirement for minimizing particle and/or heavy metal contamination, it is highly desirable for the components of such equipment to exhibit high corrosion resistance.

During processing of semiconductor substrates, the substrates are typically held in place within the vacuum chamber by substrate holders such as mechanical clamps and electrostatic clamps (ESC). Examples of such clamping systems and components thereof can be found in commonly owned U.S. Pat. Nos. 5,262,029 and 5,838,529. Process gas can be supplied to the chamber in various ways such as by a gas distribution plate. An example of a temperature controlled gas distribution plate for an inductively coupled plasma reactor and components thereof can be found in commonly owned U.S. Pat. No. 5,863,376. In addition to the plasma chamber equipment, other equipment used in processing semiconductor substrates include transport mechanisms, gas supply systems, liners, lift mechanisms, load locks, door mechanisms, robotic arms, fasteners, and the like. Various components of such equipment are subject to corrosive conditions associated with semiconductor processing. Further, in view of the high purity requirements for processing semiconductor substrates such as silicon wafers and dielectric materials such as the glass substrates used for flat panel displays, components having improved corrosion resistance are highly desirable in such environments.

Aluminum and aluminum alloys are typically used for walls, electrodes, substrate supports, fasteners and other components of plasma reactors. In order to prevent corrosion of the such metal components, various techniques have been proposed for coating the aluminum surface with various coatings. For instance, U.S. Pat. No. 5,641,375 discloses that aluminum chamber walls have been anodized to reduce plasma erosion and wear of the walls. The '375 patent states that eventually the anodized layer is sputtered or etched off and the chamber must be replaced. U.S. Pat. No. 5,895,586 discloses that a technique for forming a corrosion resistant film of $Al_2O_3$, AlC, TiN, TiC, AlN or the like on aluminum material can be found in Japanese Application Laid-Open No. 62-103379. U.S. Pat. No. 5,680,013 states that a technique for flame spraying $Al_2O_3$ on metal surfaces of an etching chamber is disclosed in U.S. Pat. No. 4,491,496. The '013 patent states that the differences in thermal expansion coefficients between aluminum and ceramic coatings such as aluminum oxide leads to cracking of the coatings due to thermal cycling and eventual failure of the coatings in corrosive environments. U.S. Pat. No. 5,879,523 discloses a sputtering chamber wherein a thermally sprayed coating of $Al_2O_3$ is applied to a metal such as stainless steel or aluminum with an optional $NiAl_x$ bond coating therebetween. U.S. Pat. No. 5,522,932 discloses a rhodium coating for metal components of an apparatus used for plasma processing of substrates with an optional nickel coating therebetween.

Liner arrangements have also been proposed to protect the walls of plasma reaction chambers. For instance, U.S. Pat. No. 5,798,016 discloses a liner of a ceramic material, aluminum, steel and/or quartz. U.S. Pat. No. 5,366,585 discloses a free standing ceramic liner machined from solid alumina. The '585 patent also discloses coating aluminum with flame sprayed or plasma sprayed aluminum oxide. U.S. Pat. No. 5,885,356 discloses ceramic liner materials for use in CVD chambers.

As integrated circuit devices continue to shrink in both their physical size and their operating voltages, their associated manufacturing yields become more susceptible to particle and metallic impurity contamination. Consequently, fabricating integrated circuit devices having smaller physical sizes requires that the level of particulate and metal contamination be less than previously considered to be acceptable.

In view of the foregoing, there is a need for high density plasma processing chambers having internal, plasma exposed surfaces that are more resistant to erosion and assist in minimizing contamination (e.g., particles and metallic impurities) of the wafer surfaces being processed.

SUMMARY OF THE INVENTION

In a first embodiment of the present invention, a process of making a component of semiconductor processing equipment is provided. The process includes providing a liquid crystalline polymer on a surface of the component such that the liquid crystalline polymer forms an outermost surface of the component.

In a second embodiment of the present invention, a component of semiconductor processing equipment is provided wherein the component includes a liquid crystalline polymer. A plasma chamber including at least one component as set forth above is also provided.

In a third embodiment of the present invention, a method of processing a semiconductor substrate in a plasma chamber as set forth above is provided. In the method according to the present invention, a substrate is transferred into the plasma chamber and an exposed surface of the substrate is processed with a plasma. In a further preferred embodiment of the present invention, the method includes steps of: positioning the substrate on a substrate support in the reactor; introducing a process gas into the reactor; applying RF energy to the process gas to generate a plasma adjacent an exposed surface of the substrate; and etching the exposed substrate surface with a plasma.

BRIEF DESCRIPTION OF THE DRAWINGS

The invention will be described in greater detail with reference to accompanying drawings in which like elements bear like reference numerals, and wherein.

DETAILED DESCRIPTION OF THE PREFERRED EMBODIMENTS OF THE INVENTION

Figure 1:
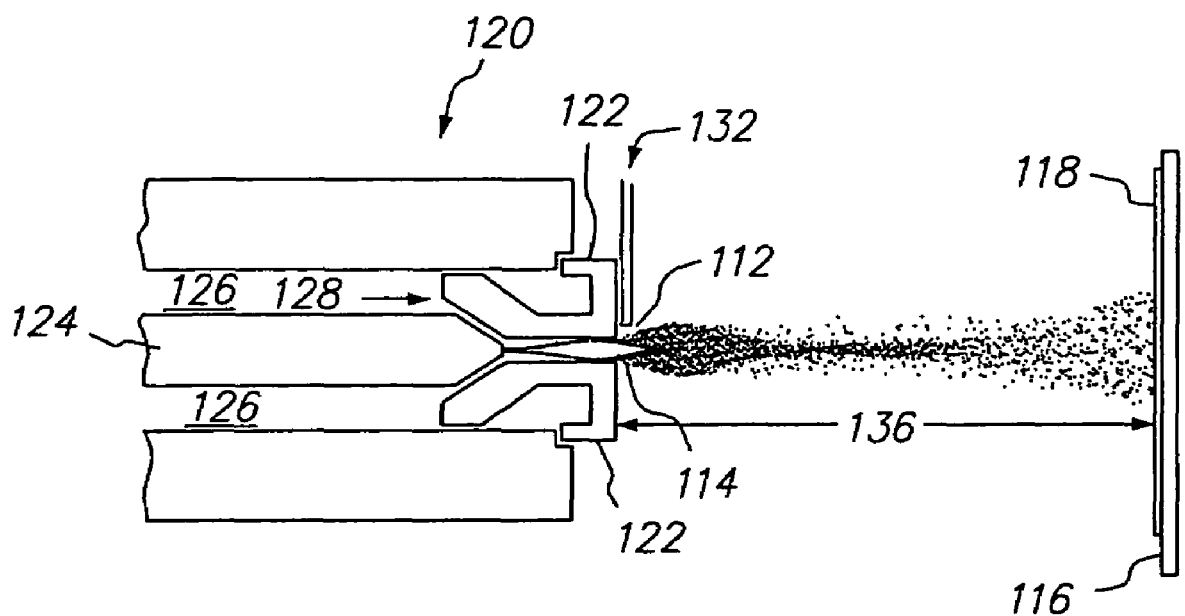
FIG. 1 illustrates a conventional plasma spray process.

The first layer of conductive material in an integrated circuit (IC) is a thin film of polysilicon or polysilicide that is in direct contact with transistors embedded in the wafer surface. After the polysilicon has been etched, only the conductive traces needed to operate the transistors and make point-to-point connections between them remain. Because the poly etch is conducted on the wafer surface, control of contamination is particularly important.

Typically, a processing chamber that is used for etching materials such as polysilicon requires relatively high energies to achieve the desired etch result. The need for high energies stems from the need to bombard and break the strong bonds of the polysilicon films and drive chemical reactions to form volatile etch products. These chambers are therefore referred to as "high density etch chambers," that are capable of producing high plasma densities in order to provide a high ion flux to the wafer and achieve high etch rates at low gas pressures.

While high density etch chambers work well in etching the desired surfaces, the internal surfaces of the etch chamber can be subjected to the high ion power. Therefore, material from the internal surfaces of the etch chamber is removed as a result of the ion bombardment by either physical sputtering or chemical sputtering, depending on the composition of the material and the composition of the etch gas. In view of the need for high purity and corrosion resistance for components of semiconductor processing equipment, there is a need in the art for improvements in materials and/or coatings used for such components. Moreover, with regard to the chamber materials, any materials which can increase the service life of a plasma reactor chamber and thus reduce the down time of the apparatus, would be beneficial in reducing the cost of processing the semiconductor wafers.

The present invention provides an effective way to provide corrosion resistance to the surfaces of components of semiconductor processing apparatus such as parts of a plasma processing reactor chamber. Such components include chamber walls, substrate supports, gas distribution systems (including showerheads, baffles, rings, nozzles, etc.), fasteners, heating elements, plasma screens, liners, transport module components, such as robotic arms, fasteners, inner and outer chamber walls, etc., and the like. In the present invention, the components themselves can be made from a liquid crystalline polymer (LCP) or the plasma exposed surfaces of the components can be coated or otherwise covered with a liquid crystalline polymer.

Liquid crystalline polymers are high melting point thermoplastic polymers. Polymers typically have randomly oriented molecules in the melt phase, but when liquid crystalline polymers melt, their long, rigid molecules can align into a highly ordered configuration that produces a number of unique features. These include low heat of crystallization, extremely high flow, and significant melt strength.

The present inventors have discovered that liquid crystalline polymers have desirable properties for use in plasma etch chambers. In particular, liquid crystalline polymers provide erosion resistant surfaces that can reduce the levels of particulate contamination in reactor chambers. The liquid crystalline polymers produce volatile by-products when etched, sputtered and/or chemically attacked by reactive species in the plasma. These volatile by-products can be readily evacuated from the process chamber.

According to a preferred embodiment of the present invention, the liquid crystalline polymer is plasma-sprayed onto the surface of a plasma reactor component. Plasma spraying allows intricate interior surfaces of the chamber or other chamber components to be coated. An exemplary technique for plasma spraying a liquid crystalline polymer is disclosed in U.S. Pat. No. 6,120,854. For plasma spraying, the liquid crystalline polymers are typically used in the form of a particulate feedstock.

The plasma spraying process typically involves spraying a molten or heat softened material onto a surface. FIG. 1 illustrates a typical plasma spraying process. The coating material, usually in the form of a powder 112, is injected into a high temperature plasma flame 114 where it is rapidly heated and accelerated to a high velocity. The hot material impacts on the substrate surface 116 and rapidly cools to form a coating 118. As a result, the as-sprayed surface is generally rough and textured.

The plasma spray gun 120 typically comprises a copper anode 122 and tungsten cathode 124, both of which are water cooled. Plasma gas 126 (argon, nitrogen, hydrogen, helium) flows around the cathode in the direction generally indicated by arrow 128 and through an anode 130 which is shaped as a constricting nozzle. The plasma is initiated by a high voltage discharge which causes localized ionization and a conductive path for a DC arc to form between the cathode 124 and the anode 130. Resistance heating from the arc causes the gas to reach extreme temperatures, dissociate and ionize to form a plasma. The plasma exits the anode nozzle 130 as a free or neutral plasma flame (plasma which does not carry electric current). When the plasma is stabilized ready for spraying, the electric arc extends down the nozzle. Powder 112 is fed into the plasma flame usually via an external powder port 132 mounted near the anode nozzle exit 134. The powder 112 is so rapidly heated and accelerated that the spray distance 136 (the distance between the nozzle tip and the substrate surface) can be on the order of 125 to 150 mm. Plasma sprayed coatings are thus produced by a process in which molten or heat-softened particles are caused to impact on a substrate.

In the present invention, surface preparation techniques such as cleaning and grit or bead blasting can be used to provide a more chemically and physically active surface for bonding. Prior to coating, the surface of the substrate is preferably thoroughly cleaned to remove surface material such as oxides or grease. Further, the surface can be roughened by known methods such as grit blasting prior to coating. By grit blasting, the surface area available for bonding can be increased which can increase the coating bond strength. The rough surface profile can also promote mechanical keying or interlocking of the coating with the substrate.

A suitable liquid crystalline polymer for use according to the present invention is VECTRA® LCP, which is a registered trademark of Celanese AG. VECTRA® LCP is an aromatic polyester polymer that is thermotropic and flows readily in the molten state. Other liquid crystalline polymers that may be used include ZENITE® LCP, which is a registered trademark of E.I. DuPont de Nemours and Company. Other suitable liquid crystalline polymers are disclosed in U.S. Pat. Nos. 5,216,092 and 5,296,542.

Figure 2:
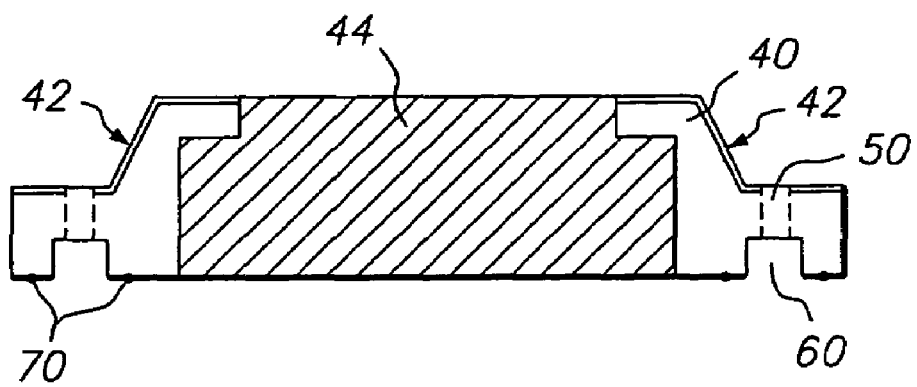
FIG. 2 shows a cross-sectional view of a gas ring apparatus for a polysilicon etching apparatus according to one embodiment of the present invention.

In a preferred embodiment of the invention, the liquid crystalline polymer components are used as components in a polysilicon high-density plasma reactor. An exemplary reactor of this type is the TCP 9400™ plasma etch reactor available from LAM Research Corporation of Fremont, Calif. In the TCP 9400™ reactor, processing gases (such as $Cl_2$, HBr, $CF_4$, $CH_2F_2$, $O_2$, $N_2$, Ar, $SF_6$ and $NF_3$) are conducted into a gas ring located on the bottom of the etch chamber and are then guided through gas holes into the reactor chamber. FIG. 2 shows a cross-sectional view of a gas ring for a polysilicon etch reactor according to the present invention. As shown in FIG. 2, the main body of the gas ring 40 surrounds a substrate support 44. The bottom surface of the gas ring 40 contains a ring-shaped gas-guiding trench 60. The aforementioned gas holes 50 extend into the gas-guiding trench 60.

The gas ring is typically composed of aluminum. The upper surfaces of the gas ring are directly exposed to the plasma and are thus subject to erosion. To protect these surfaces, the gas ring is typically covered with an aluminum oxide layer. According to the present invention, the exposed surfaces of the gas ring can be covered with a coating 42 of a liquid crystalline polymer. The liquid crystalline polymer can be coated on a bare (except for a native oxide) aluminum layer or on an aluminum oxide layer (e.g., aluminum having an anodized surface). The coating is preferably applied using a plasma spray process but other coating methods suitable for use with liquid crystalline polymers may also be employed. When coating the gas ring, the coating can be allowed to partially penetrate into the gas holes to coat and protect the inside walls thereof. However, the coating material should not be applied in such a manner as to obstruct the openings. Therefore, the gas holes can be plugged or masked during the coating process.

Other components of the polysilicon etch reactor which can be exposed to the plasma during processing can also be coated with a liquid crystalline polymer according to the present invention. These components include chamber walls, chamber liners, an electrostatic chuck and the dielectric window opposite the substrate. Providing a coating of liquid crystalline polymer on the upper surface of the electrostatic chuck provides additional protection to the chuck during cleaning cycles in which a wafer is not present and the upper surface of the chuck is thus directly exposed to the plasma.

The reactor components of the present invention can also be used in a high-density oxide etch process. An exemplary oxide etch reactor is the TCP 9100™ plasma etch reactor available from LAM Research Corporation of Fremont, Calif. In the TCP 9100™ reactor, the gas distribution plate is a circular plate situated directly below the TCP™ window which is also the vacuum sealing surface at the top of the reactor in a plane above and parallel to a semiconductor wafer. The gas distribution plate is sealed using an O-ring to a gas distribution ring located at the periphery of the gas distribution plate. The gas distribution ring feeds gas from a source into the volume defined by the gas distribution plate, an inside surface of a window underlying an antenna in the form of a flat spiral coil supplying RF energy into the reactor, and the gas distribution ring. The gas distribution plate contains an array of holes of a specified diameter which extend through the plate. The spatial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate material must be a dielectric to enable coupling of this RF power through the gas distribution plate into the reactor. Further, it is desirable for the material of the gas distribution plate to be highly resistant to chemical sputter-etching in environments such as oxygen or a hydro-fluorocarbon gas plasma in order to avoid breakdown and the resultant particle generation associated therewith.

Figure 3:
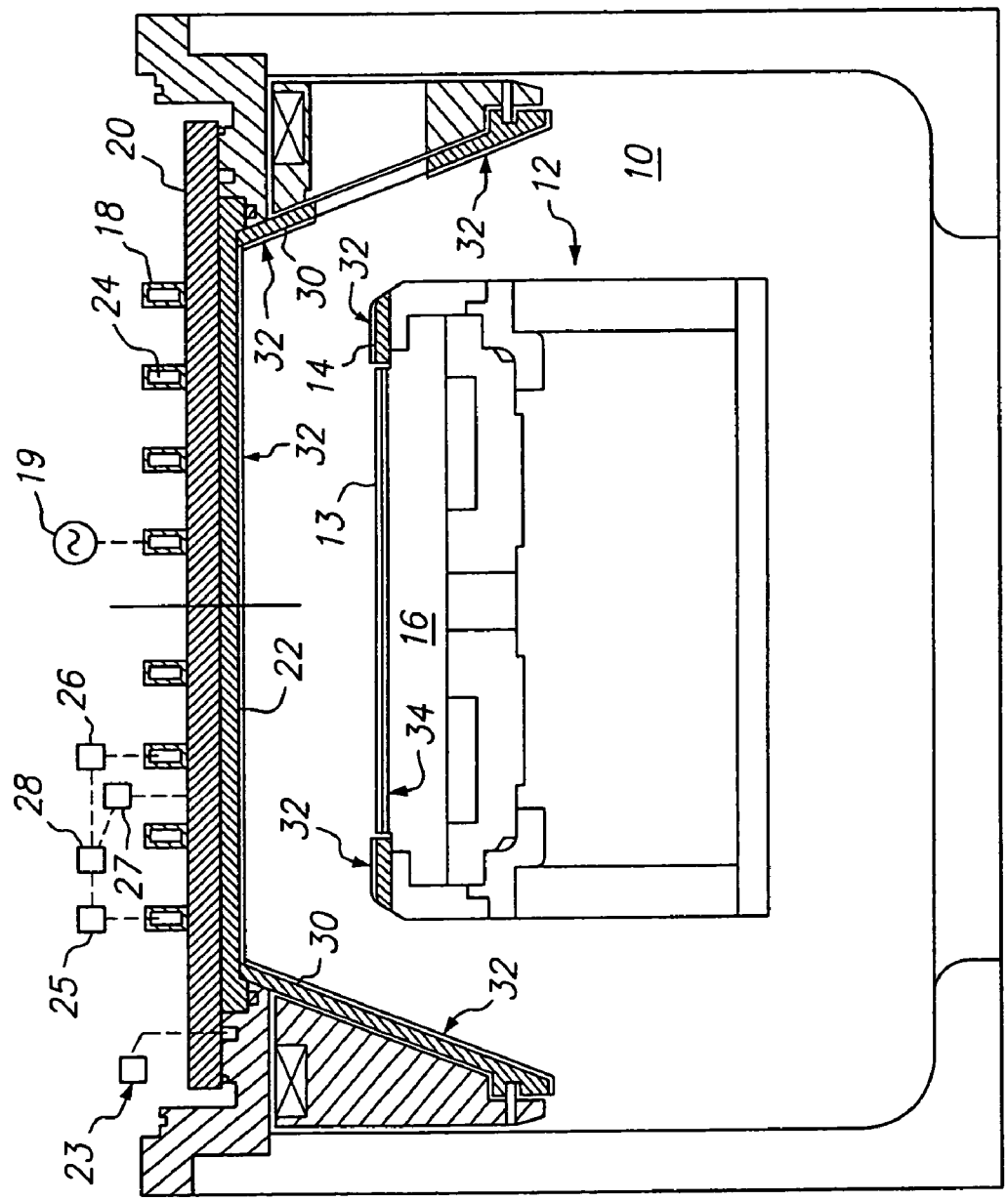
FIG. 3 shows a high density oxide etch chamber containing components according to the present invention.

FIG. 3 illustrates a plasma reactor of the aforementioned type. The reactor comprises a reactor chamber 10 that includes a substrate holder 12 including an electrostatic chuck 34 which provides a clamping force to a substrate 13 as well as an RF bias to a substrate. The substrate can be back-cooled using a heat transfer gas such as helium. A focus ring 14 comprises a dielectric outer ring 14a and an inner ring 14b which confines plasma in an area above the substrate. A source of energy for maintaining a high density (e.g., $10^{11}$-$10^{12}$ ions/$cm^3$) plasma in the chamber such as an antenna 18 powered by a suitable RF source to provide a high density plasma is disposed at the top of reactor chamber 10. The chamber includes suitable vacuum pumping apparatus for maintaining the interior of the chamber at a desired pressure (e.g., below 50 mTorr, typically 1-20 mTorr).

A substantially planar dielectric window 20 of uniform thickness provided between the antenna 18 and the interior of the processing chamber 10 forms the vacuum wall at the top of the processing chamber 10. A gas distribution plate 22 is provided beneath window 20 and includes openings such as circular holes for delivering process gas from the gas supply 23 to the chamber 10. A conical liner 30 extends from the gas distribution plate and surrounds the substrate holder 12. The antenna 18 can be provided with a channel 24 through which a temperature control fluid is passed via inlet and outlet conduit 25, 26. However, the antenna 18 and/or window 20 need not be cooled or could be cooled by other techniques such as by blowing air over the antenna and window, passing a cooling medium through or in heat transfer contact with the window and/or gas distribution plate, etc.

In operation, a semiconductor substrate such as a silicon wafer is positioned on the substrate holder 12 and held in place by an electrostatic chuck 34. Other clamping means, however, such as a mechanical clamping mechanism can also be used. Additionally, helium back-cooling can be employed to improve heat transfer between the substrate and chuck. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. Pat. Nos. 5,824,605; 6,048,798; and 5,863,376. A high density plasma is ignited in the space between the substrate and the window by supplying suitable RF power to the antenna 18.

In FIG. 3, the internal surfaces of reactor components such as the gas distribution plate 22, the chamber liner 30, the electrostatic chuck 34, and the focus ring 14 are shown coated with a coating 32 of a liquid crystalline polymer. However, in the present invention, any or all of these surfaces can be provided with a liquid crystalline polymer coating according to the present invention.

The high density polysilicon and dielectric etch chambers described above are only exemplary of plasma etch reactors which can incorporate components according to the present invention. The liquid crystalline polymer components of the present invention can be used in any etch reactor (e.g., a metal etch reactor) or other type of semi-conductor processing equipment where plasma erosion is a problem.

Other components which may be provided with liquid crystalline polymer coatings include chamber walls (typically made from aluminum having an anodized or non-anodized surface) substrate holders, fasteners, etc. These parts are typically made from metal (e.g., aluminum) or ceramic (e.g., alumina). These plasma reactor components are typically exposed to plasma and often show signs of corrosion. Other parts which can be coated in accordance with the present invention may not be directly exposed to plasma but instead are exposed to corrosive gases such as gases emitted from processed wafers or the like. Therefore, other equipment used in processing semiconductor substrates can also be provided with liquid crystalline polymer surfaces according to the present invention. Such equipment can include transport mechanisms, gas supply systems, liners, lift mechanisms, load locks, door mechanisms, robotic arms, fasteners, and the like.

Examples of metals and/or alloys that can be coated by a liquid crystalline polymer according to the present invention include aluminum, stainless steel, refractory metals, e.g., "HAYNES 242" "Al-6061", "SS 304", "SS 316". Since the liquid crystalline polymer forms a corrosion resistant coating over the component, the underlying component is no longer directly exposed to the plasma and aluminum alloys can be used without regard to alloying additions, grain structure or surface conditions. Additionally, various ceramic or polymeric materials may also be coated with a liquid crystalline polymer according to the present invention. In particular, the reactor components can be made from ceramic materials such as alumina ($Al_2O_3$), silicon carbide (SiC), silicon nitride ($Si_3N_4$), boron carbide ($B_4C$) and/or boron nitride (BN).

If desired, one or more intermediate layers of material can be provided between the liquid crystalline polymer coating and the surface of the component.

Although plasma spraying is a preferred method of providing components having liquid crystalline polymer surfaces, other methods may also be employed. For example, the liquid crystalline polymer can be formed into sheets using conventional thermoplastic processing techniques such as injection molding or extrusion. These preformed sheets can be formed into a desired shape and used to cover the plasma exposed surfaces of various reactor components. When the liquid crystalline polymer is applied to the reactor component surfaces as preformed sheets, the sheets can be attached by any known means including adhesive bonding or by the use of mechanical fasteners. When fasteners are used, the fasteners themselves, if exposed to the plasma, should also be made from an erosion resistant material such as a liquid crystalline polymer. Additionally, the liquid crystalline polymer covering may be designed to interlock with the underlying reactor component.

In another embodiment of the invention, the liquid crystalline polymer can also be melt or solution coated onto the surfaces of reactor components using known techniques.

In a further embodiment, the reactor components can be made entirely from a liquid crystalline polymer by machining the component out of a block of the liquid crystalline polymer material or by molding (e.g., injection molding) the component from the liquid crystalline polymer material.

The liquid crystalline polymer according to the present invention can include one or more fillers such as glass or mineral fillers. The filler should be chosen based on its suitability for a plasma environment. During use, the liquid crystalline polymer can erode exposing the filler directly to the plasma. The filler should therefore be free of heavy metals or other constituents which may cause contamination of substrates being processed within the chamber.

While the invention has been described in detail with reference to specific embodiments thereof, it will be apparent to those skilled in the art that various changes and modifications can be made, and equivalents employed, without departing from the scope of the appended claims.

What is claimed is:

1. A process of making a component of semiconductor processing equipment, the process comprising plasma spraying a liquid crystalline polymer on a surface of the component by feeding liquid crystalline polymer powder into a plasma flame to form molten or heat-softened particles, wherein the liquid crystalline polymer particles form a plasma sprayed coating on an outermost surface of the component.

2. The process according to claim 1, wherein the component is a plasma chamber wall, a chamber liner, a gas distribution plate, a gas ring, a pedestal, an electrostatic chuck or a focus ring.

3. The process according to claim 1, wherein the component comprises a ceramic part made from alumina.

4. The process according to claim 1, further comprising subjecting the surface of the component to a surface roughening treatment prior to plasma spraying the liquid crystalline polymer coating.

5. The process according to claim 1, wherein the component comprises a metal part made from aluminum or an aluminum alloy having an anodized or non-anodized surface.

6. The process according to claim 1, wherein the liquid crystalline polymer contains a filler.

7. The process according to claim 1, wherein the method further comprises depositing at least one intermediate layer between the surface of the component and the coating.

8. The process according to claim 1, wherein the component is of stainless steel, a refractory metal or a polymeric material.

9. The process according to claim 1, wherein the component is of a ceramic material selected from the group consisting of silicon carbide, silicon nitride, boron carbide and boron nitride.

10. A process of making a component of semiconductor processing equipment, the process comprising applying a liquid crystalline polymer in the form of a preformed sheet as a covering to a surface of the component, wherein the liquid crystalline polymer is configured to interlock with the component and forms an outermost surface of the component.

11. The process according to claim 10, wherein the preformed sheet is attached to the surface of the component by adhesive bonding.

12. The process according to claim 10, wherein the preformed sheet is attached to the surface with fasteners.

13. A process of making a component of semiconductor processing equipment, the process comprising providing a liquid crystalline polymer on a surface of the component, wherein the liquid crystalline polymer forms an outermost surface of the component, wherein the component is a component selected from the group consisting of a plasma chamber wall, a gas distribution plate, a gas ring, a pedestal, an electrostatic chuck and a focus ring and comprises a liquid crystalline polymer on an outer surface thereof, the liquid crystalline polymer comprises a coating on a bead or grit-blasted roughened surface of the component which is mechanically keyed or interlocked with the coating.

* * * * *